(12) United States Patent
Lu et al.

(10) Patent No.: US 7,816,194 B2
(45) Date of Patent: Oct. 19, 2010

(54) METHOD OF MANUFACTURING THIN FILM TRANSISTOR

(75) Inventors: Ya-Ju Lu, Taipei County (TW); Jun-Yao Huang, Taipei County (TW); Ming-Chu Chen, Taipei (TW); Yu-Fang Wang, Taoyuan County (TW); Chun-Jen Ma, Taichung (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 12/544,231

(22) Filed: Aug. 20, 2009

(65) Prior Publication Data

US 2010/0227442 A1 Sep. 9, 2010

(30) Foreign Application Priority Data

Mar. 6, 2009 (TW) .............................. 98107407 A

(51) Int. Cl.
*H01L 21/84* (2006.01)

(52) U.S. Cl. ................ 438/164; 438/151; 257/E21.415

(58) Field of Classification Search .................. 438/151, 438/158, 159, 160, 164

See application file for complete search history.

(56) References Cited

U.S. PATENT DOCUMENTS

| 6,395,586 B1* | 5/2002 | Huang et al. ................. 438/149 |
| 6,924,179 B2* | 8/2005 | Oh et al. ...................... 438/157 |
| 2007/0166894 A1* | 7/2007 | Lim ............................ 438/151 |

* cited by examiner

*Primary Examiner*—Charles D Garber
*Assistant Examiner*—Reema Patel
(74) *Attorney, Agent, or Firm*—Jianq Chyun IP Office

(57) ABSTRACT

A method of manufacturing thin film transistor is provided, in which the method of manufacturing includes a new etching process of island semiconductor. The new etching process of island semiconductor is controlled by a flow rate of etching gas and a regulation of etching power. When etching the island semiconductor, a part of gate insulation layer exposed out of the island semiconductor is etched at the same time. Consequently, the thickness of gate insulation layer over the storage capacitance electrode is reduced, the distance between the pixel electrode and the storage capacitance electrode is decreased, and the storage capacitance of pixel is increased. Finally, the width of storage capacitance electrode is reduced appropriately and the aperture ratio of product is increased.

12 Claims, 11 Drawing Sheets

METHOD OF MANUFACTURING THIN FILM TRANSISTOR

CROSS-REFERENCE TO RELATED APPLICATION

This application claims the priority benefit of Taiwan application serial no. 98107407, filed on Mar. 6, 2009. The entirety of the above-mentioned patent application is hereby incorporated by reference herein and made a part of specification.

BACKGROUND OF THE INVENTION

1. Field of the Invention

The present invention relates a method of manufacturing a thin film transistor. More particularly, the present invention relates to a manufacturing method capable of etching an island semiconductor and reducing a thickness of a gate insulation layer at the same time.

2. Description of Related Art

Liquid crystal displays adopting thin film transistors (TFTs) are now popularly utilized in flat panel displays (referred as TFT-LCDs). Due to portability and display quality thereof, TFT-LCDs are widely applied in fields such as notebook computers, large-sized LCD TVs, and the like.

FIGS. 1A through 1E are cross-sectional views of five conventional photolithographic etching processes in a method of manufacturing a TFT:

Step 1: referring to FIG. 1A, a first metal layer is deposited on an insulation substrate 100, and a gate 110 and a storage capacitance electrode 111 are defined by a first photolithographic etching process.

Step 2: referring to FIG. 1B, after a gate insulation layer 120, an active layer 130, and an ohmic contact layer 140 are formed, an island semiconductor 102 is defined by a second photolithographic etching process.

Step 3: referring to FIG. 1C, after a second metal layer is deposited, a source 150 and a drain 160 are defined by a third photolithographic etching process and the second metal layer is used as a mask for etching the ohmic contact layer 140 to form a TFT back channel region.

Step 4: referring to FIG. 1D, after a passivation layer 170 is formed, a contact hole 180 is defined by a fourth photolithographic etching process and a part of the drain 160 is exposed.

Step 5: referring to FIG. 1E, after the transparent conductive layer is formed, a pixel electrode 190 is defined by a fifth photolithographic etching process, and the pixel electrode 190 and the drain 160 are electrically connected via the contact hole 180.

Referring to FIG. 1E continuously, the pixel electrode 190 stacks on the passivation layer 170 and the gate insulation layer 120 is opposite to the storage capacitance electrode 111 so as to form a capacitance C of the pixel. As illustrated in parallel plate capacitance equation (1), a size of the storage capacitance C of the pixel is proportional to an overlapped area A of the pixel electrode 190 and the storage capacitance electrode 111 and inversely proportional to a distance d between the pixel electrode 190 and the storage capacitance electrode 111.

$$C = \varepsilon \frac{A}{d} \quad (1)$$

($\varepsilon$ is a dielectric constant)

Since a predetermined value of the storage capacitance of the pixel is closely related to a charging/discharging property of the pixel of the TFT-LCD, an overgreat storage capacitance may have a problem of insufficient charging, and an oversmall storage capacitance easily results in flickering on a display frame. Moreover, scan lines, data lines, and storage capacitance electrode lines utilized in a thin film transistor array substrate of the TFT-LCD generally adopt light shielding metal materials. As the metal lines shield the light transmitted, an aperture ratio of the product is greatly restricted so that a power consumption of the backlight module increases. If the aperture ratio of the TFT-LCD is enhanced by reducing a width of the scan lines and the data lines, a RC loading of the TFT-LCD lines is then increased, thereby causing a distortion in signal transmission. On the other hand, if the aperture ratio of the TFT-LCD is enhanced by reducing a width of the storage capacitance electrode, then the storage capacitance may not satisfy the requirement, thereby causing flickering on the display frame and affecting display quality.

To solve the problems aforementioned, the method of manufacturing the TFT is provided in the present invention. By adjusting etching parameters of the island semiconductor, a part of the gate insulation layer exposed out of the island semiconductor is etched while the island semiconductor is being etched such that no extra processing steps are required. As a result, the thickness of the gate insulation layer over the storage capacitance electrode is reduced, the distance between the storage capacitance electrode and the pixel electrode is decreased, and the storage capacitance of the pixel is increased. Hence, the width of the storage capacitance electrode is reduced suitably and the aperture ratio of the product is increased.

SUMMARY OF THE INVENTION

The present invention is directed to a method of manufacturing a thin film transistor (TFT) to reduce a distance between a pixel electrode and a storage capacitance electrode for increasing a storage capacitance of a pixel. Hence, a width of the storage capacitance electrode is suitably reduced to increase an aperture ratio of a product.

To achieve the above-mentioned object, a method of manufacturing a TFT of the present invention includes following steps. A first metal layer is formed on an insulation substrate and a gate and a storage capacitance electrode are defined by a first photolithographic etching process. A gate insulation layer, an active layer, and an ohmic contact layer are formed sequentially on the insulation substrate having the first metal layer. An island semiconductor structure is subsequently defined by a second photolithographic etching process and a part of the gate insulation layer exposed out of the island semiconductor is etched at the same time. A second metal layer is formed on the insulation substrate having the island semiconductor, a source and a drain are defined by a third photolithographic etching process. Moreover, the second metal layer is applied as a mask for etching the ohmic contact layer so as to form a TFT back channel region. A passivation layer is formed on the insulation substrate having the source and the drain, and a contact hole is defined by a fourth photolithographic etching process to expose a part of the drain. A transparent conductive layer is formed on the insulation substrate having the contact hole, a pixel electrode is defined by a fifth photolithographic etching process for the pixel electrode to cover on the storage capacitance electrode and for the pixel electrode and the drain to electrically connect via the first contact hole.

In the method of manufacturing the TFT in the present invention, an auxiliary electrode is further defined by a third photolithographic etching process and the auxiliary electrode is opposite to the storage capacitance electrode. A second contact hole is further defined by a fourth photolithographic etching process to expose a part of the auxiliary electrode, so that the pixel electrode and the auxiliary electrode are electrically connected via the second contact hole.

In the method of manufacturing the TFT in the present invention, a thickness of the gate insulation layer exposed out of the island semiconductor is ⅓~⅔ of a thickness of the gate insulation layer covered by the island semiconductor.

In the method of manufacturing the TFT, a method of etching the island semiconductor and the gate insulation layer includes a dry etching process.

In the method of manufacturing the TFT in the present invention, a reactive gas in the dry etching process includes a mixed gas of sulfur hexafluoride ($SF_6$) and chlorine ($Cl_2$).

In the method of manufacturing the TFT in the present invention, a flow rate of the $SF_6$ and a flow rate of the $Cl_2$ in the dry etching process are respectively 120~300 ml/min and 100~800 ml/min.

In the method of manufacturing the TFT in the present invention, a power of the dry etching process is approximately 3000~4200 W.

In the method of manufacturing the TFT in the present invention, a material of the gate insulation layer includes silicon oxide, silicon nitride, silicon oxynitride, or a combination thereof. A material of the active layer includes amorphous silicon, and a material of the ohmic contact layer includes n+ doped silicon.

The method of manufacturing the TFT provided in the present invention is controlled by the flow rate of the etching gas and a regulation of the etching power. When etching the island semiconductor, a part of the gate insulation layer exposed out of the island semiconductor is etched at the same time. As a result, the thickness of the gate insulation layer over the storage capacitance electrode is reduced, the distance between the pixel electrode and the storage capacitance electrode is decreased, and the storage capacitance of the pixel is increased. Hence, the width of the storage capacitance electrode is reduced suitably and the aperture ratio of the product is increased. The new island semiconductor etching process is compatible with the original manufacturing process, thus no additional steps are required.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In order to make the aforementioned and other objects, features and advantages of the present invention more comprehensible, several embodiments accompanied with figures are described in detail below.

FIGS. 2A through 2J are cross-sectional views of five conventional photolithographic etching processes in a method of manufacturing a TFT according to a first embodiment of the present invention.

Figure 1A:
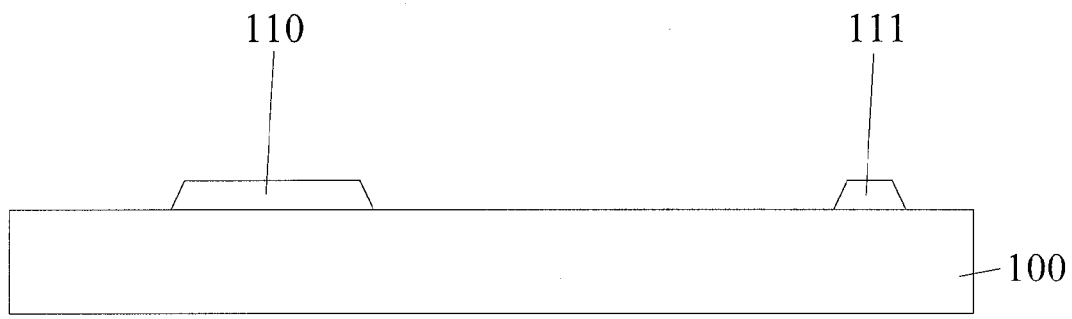
FIGS. 1A through 1E are cross-sectional views of five conventional photolithographic etching processes in a method of manufacturing a thin film transistor (TFT).
Figure 1B:
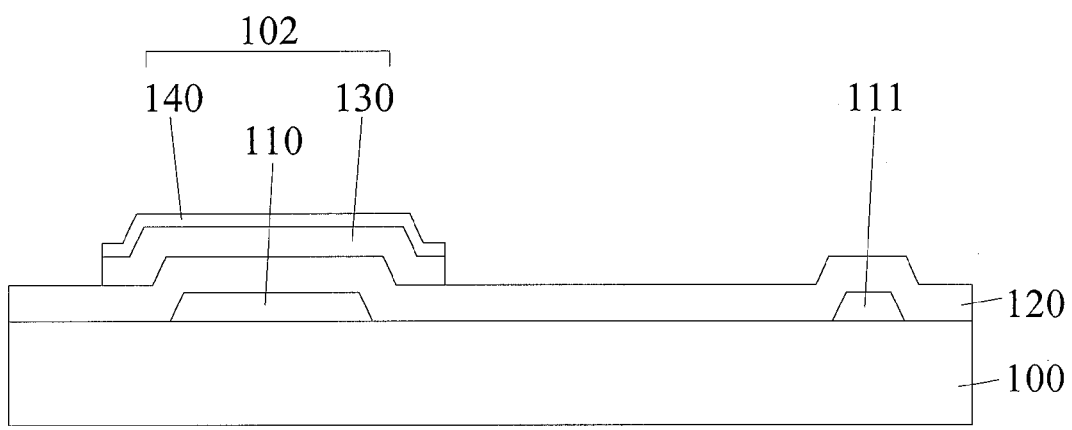
Figure 1C:
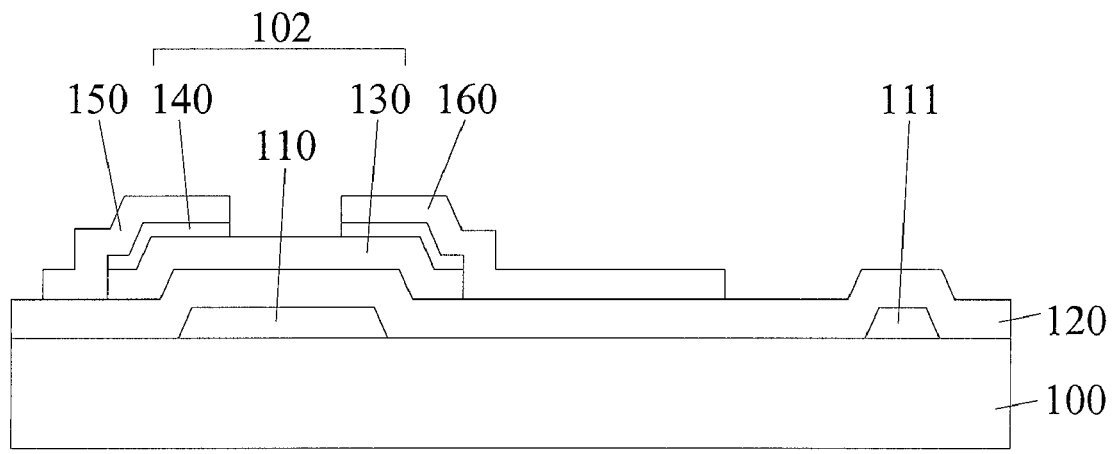
Figure 1D:
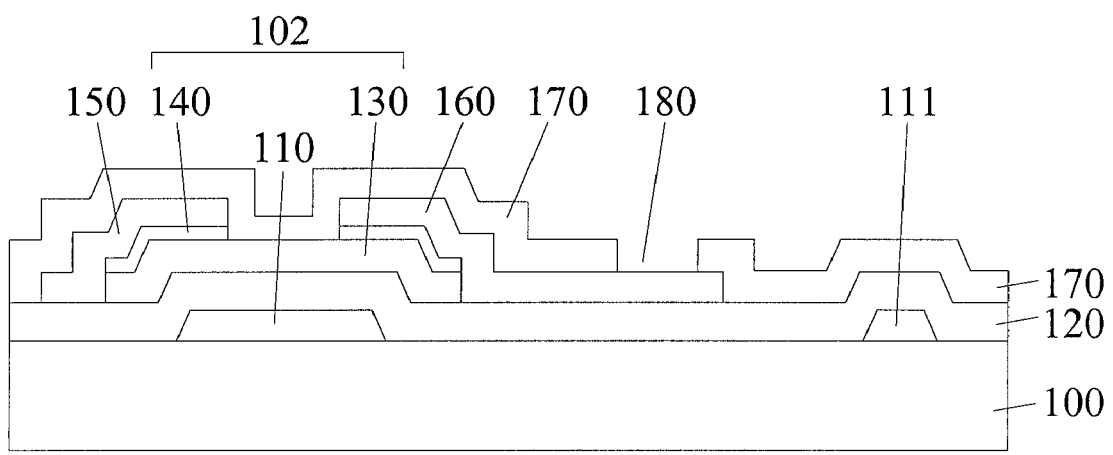
Figure 1E:
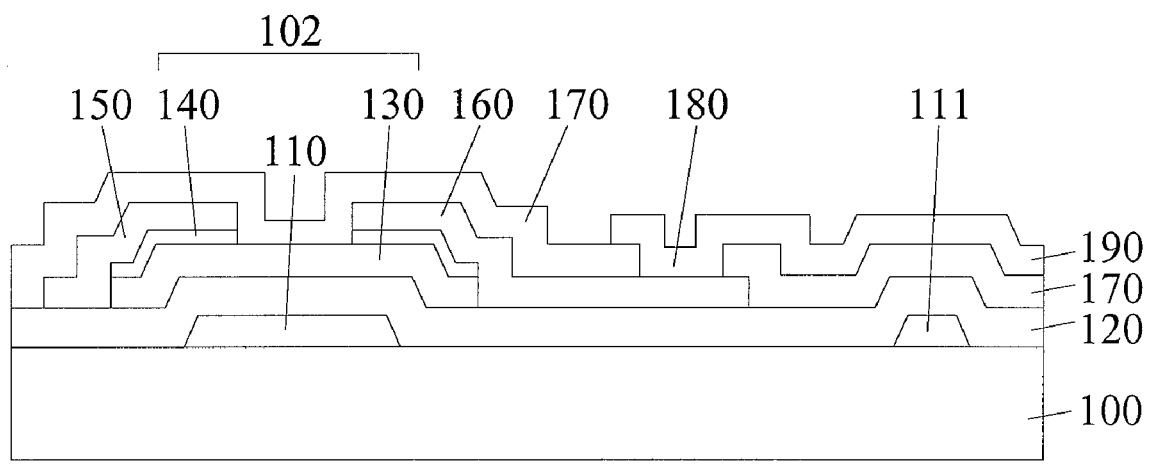
Figure 2A:
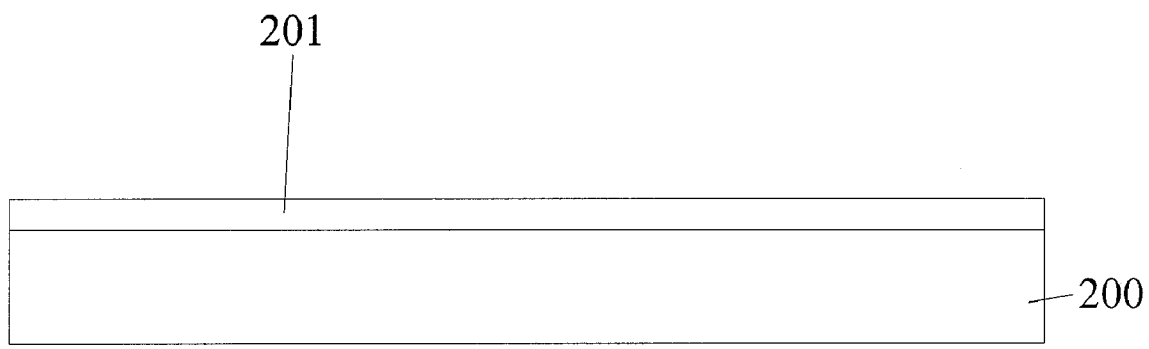
FIGS. 2A through 2J are cross-sectional views of five conventional photolithographic etching processes in a method of manufacturing a TFT according to a first embodiment of the present invention.

Referring to FIG. 2A, a material such as glass, quartz, or the like is provided as an insulation substrate 200. Next, a first metal layer 201 with a thickness of approximately 1000 to 5000 Angstroms is formed on the insulation substrate 200 by sputtering at a temperature of approximately 25 to 100° C. Generally, a material of the first metal layer 201 is selected from chromium, titanium, molybdenum, aluminum, copper, aluminum alloy, or a combination thereof. Under certain circumstances, the metal layer 201 also adopts a multi-layer structure formed by the materials aforementioned.

Figure 2B:
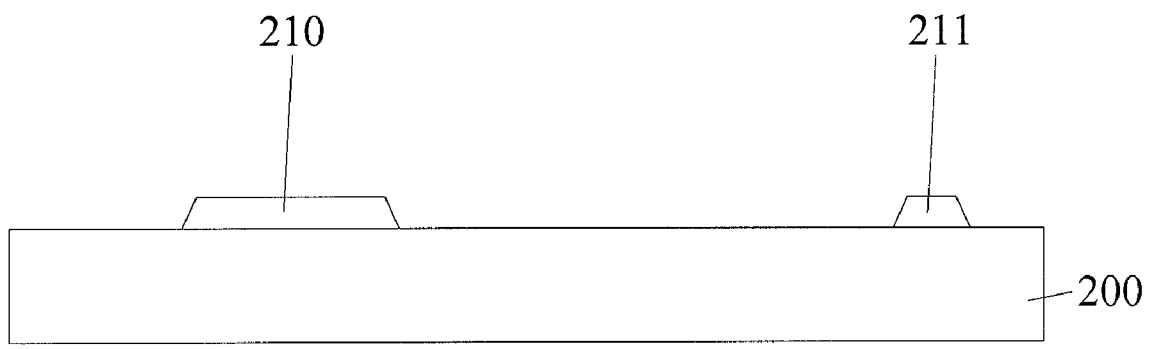

Referring to FIG. 2B, then, a first photolithographic etching process is performed to the first metal layer 201 to define a gate 210 and a storage capacitance electrode 211 on the insulation substrate 200. In one embodiment, a wet etching process is applied in the photolithographic etching process.

Figure 2C:
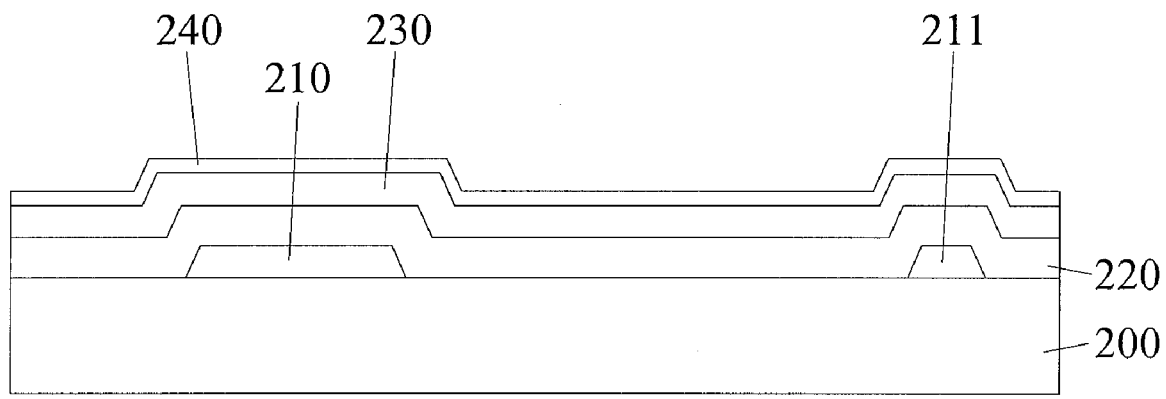

Referring to FIG. 2C, a gate insulation layer 220 is formed on the gate 210 and the storage capacitance electrode 211 for insulation. Here, a material of the gate insulation layer 220 is formed by selecting from conventional dielectric materials such as silicon oxide, silicon nitride, silicon oxynitride, or a combination thereof. In one embodiment, a plasma-enhanced chemical vapor deposition (PECVD) is utilized to form a silicon oxide or silicon nitride layer with a thickness of approximately 3000 to 4000 Angstroms in an environment with a temperature of 330° C. Reactive gases adopted in the process include $SiH_4$, $N_2O$, $NH_3$, $N_2$ or $SiH_2Cl_2$, $NH_3$, $N_2$, $N_2O$. Next, a conventional technique is applied to form an active layer 230 on the gate insulation layer 220 as a channel for forming the TFT in the following. Here, a material of the active layer 230 is amorphous silicon. Afterwards, an ohmic contact layer 240 is formed on the active layer 230 as a junction between the drain and the source of TFT and the active layer 230 in the following. Here, a material of the ohmic contact layer 240 is n+ doped silicon.

Figure 2D:
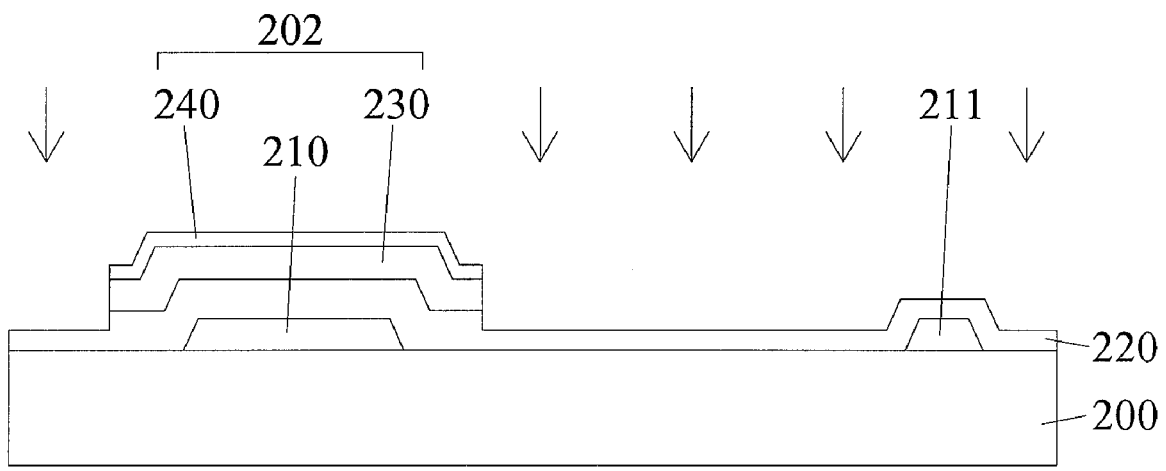

Referring to FIG. 2D, subsequently, a second photolithographic etching process is performed to the ohmic contact layer 240 and the active layer 230 to define an island semiconductor 202 on the insulation substrate 200. In one embodiment, a dry etching method is adopted to perform the photolithographic etching process, and a reactive gas thereof is a mixed gas of sulfur hexafluoride ($SF_6$) and chlorine ($Cl_2$). A flow rate of the $SF_6$ is 120~300 ml/min and a flow rate of the $Cl_2$ is 100~800 ml/min. Moreover, an etching power is 3000~4200 W. According to the manufacturing conditions illustrated above, a part of the gate insulation layer 220 exposed out of the island semiconductor 202 is etched while the island semiconductor 202 is being etched, so that a thickness of the gate insulation layer 220 is reduced to ⅓~⅔ of an original thickness thereof.

Figure 2E:
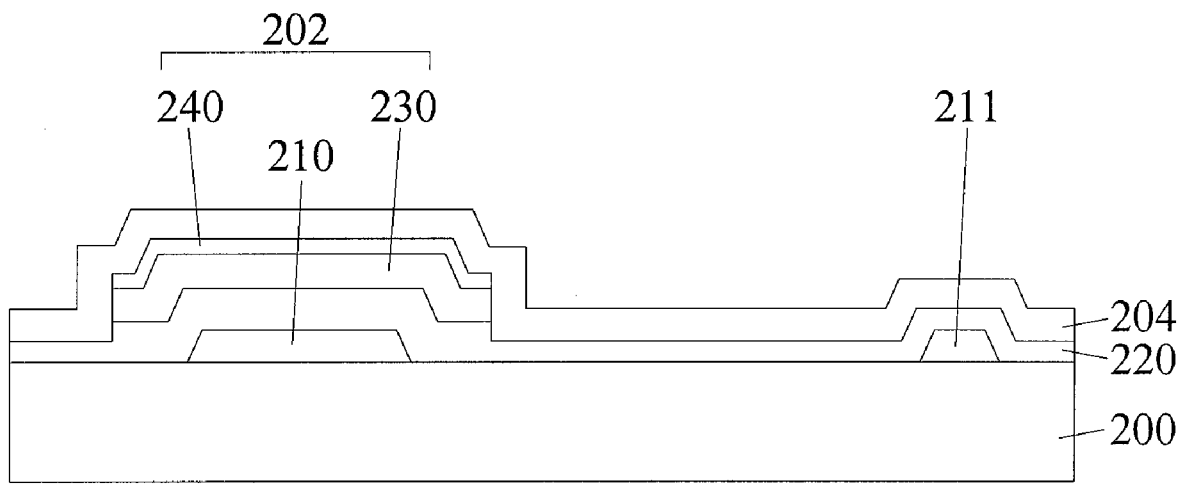

Referring to FIG. 2E, a second metal layer 204 is then formed on the ohmic contact layer 240, the active layer 230, the gate insulation layer 220, and the insulation substrate 200. A second metal layer 204 with a thickness of approximately 1000 to 5000 Angstroms is formed by sputtering at a temperature of approximately 25 to 100° C. Generally, a material of the second metal layer 204 is selected from chromium, titanium, molybdenum, aluminum, copper, aluminum alloy, or a combination thereof. Under certain circumstances, the second metal layer 204 also adopts a multi-layer structure formed by the materials aforementioned.

Figure 2F:
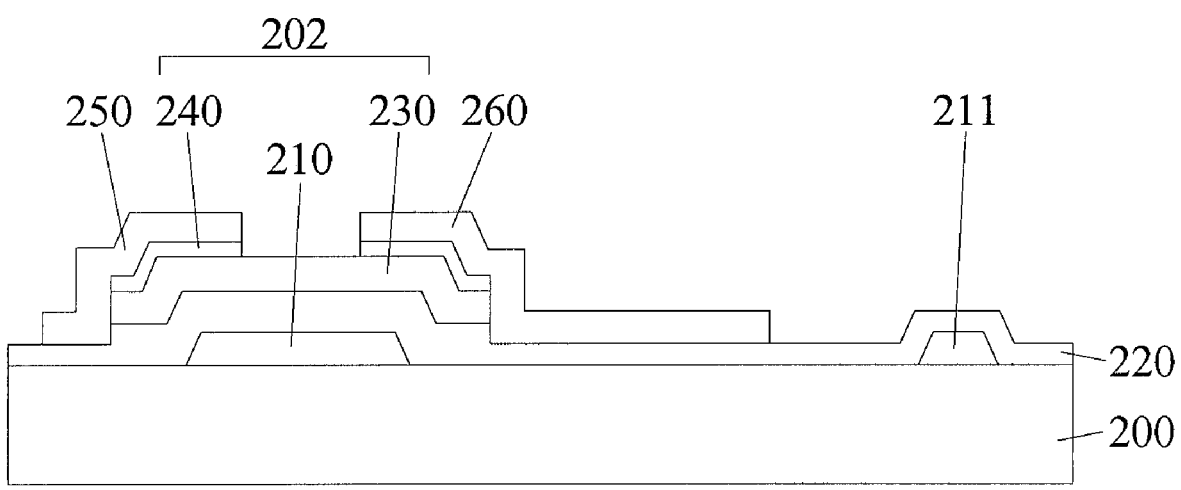

Referring to FIG. 2F, thereafter, a third photolithographic etching process is performed to the second metal layer 204 to define a source 250 and a drain 260 on the insulation substrate

200. In one embodiment, a wet etching process is applied in the photolithographic etching process. Subsequently, the source 250 and the drain 260 are used as a mask for etching the ohmic contact layer 240 to form a back channel region of the TFT.

Figure 2G:
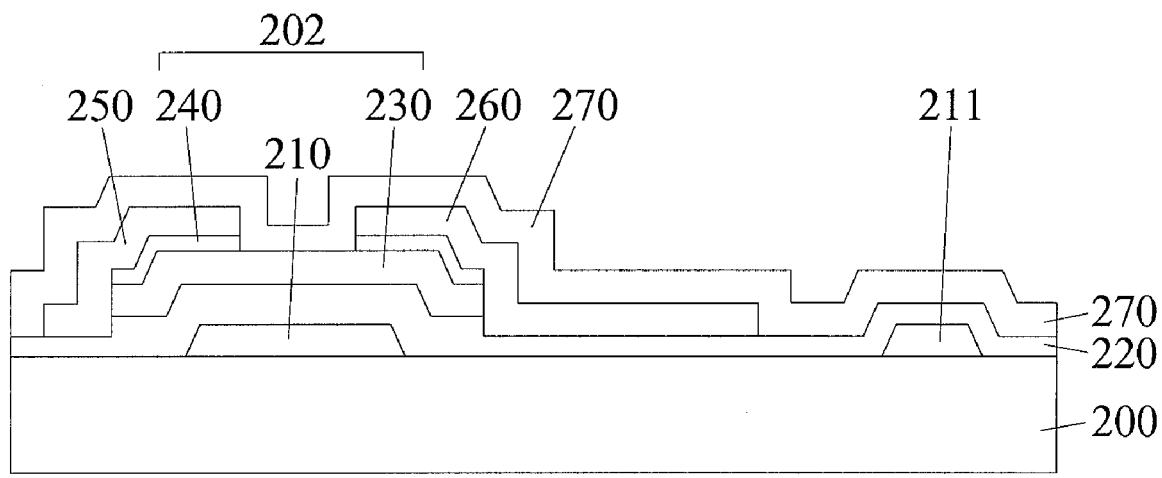

Referring to FIG. 2G, a passivation layer 270 is then formed on the source 250, the drain 260, the active layer 230, and the gate insulation layer 220 for moisture blockage and protection. A material of the passivation layer 270 is selected from conventional dielectric materials such as nitride layers, oxide layers, organic materials, or a combination thereof. In one embodiment, the plasma-enhanced chemical vapor deposition (PECVD) is utilized to form a silicon oxide or silicon nitride layer with a thickness of approximately 2000 to 4000 Angstroms in an environment with a temperature of 330° C. Reactive gases adopted in the process include $SiH_4$, $N_2O$, $NH_3$, $N_2$ or $SiH_2Cl_2$, $NH_3$, $N_2$, $N_2O$.

Figure 2H:
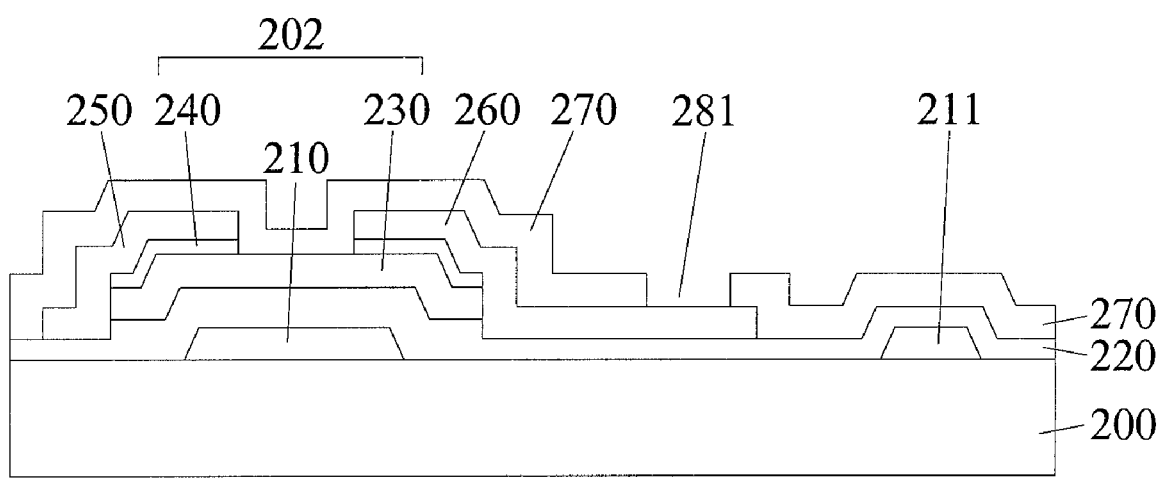

Referring to FIG. 2H, thereafter, a fourth photolithographic etching process is performed to the passivation layer 270 for defining a first contact hole 281, so that a part of the drain 260 is exposed via the first contact hole 281. In one embodiment, the dry etching process is applied in the photolithographic etching process.

Figure 2I:
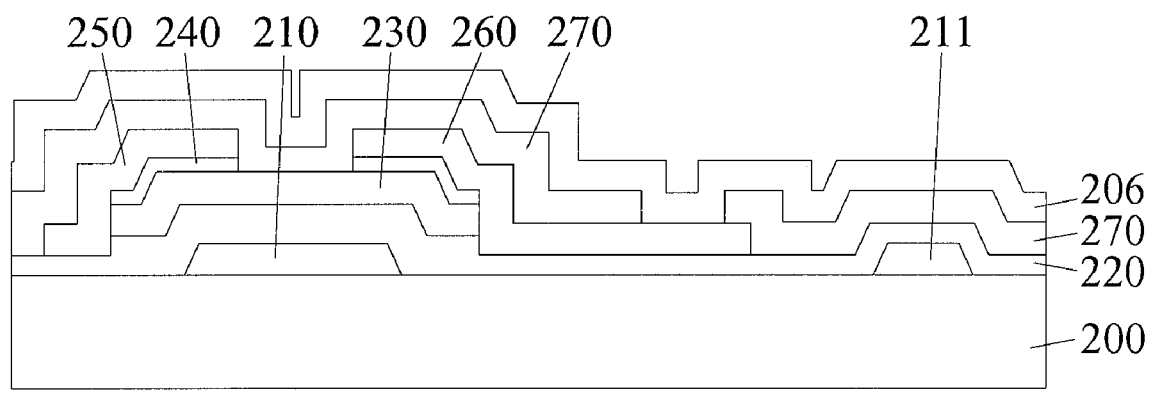

Referring to FIG. 2I, a transparent conductive layer 206 is formed on an upper surface of the passivation layer 270. In one embodiment, an indium tin oxide (ITO) thin film with a thickness of approximately 500 to 1000 Angstroms is formed by sputtering at a temperature of approximately 25° C. and is adopted as the transparent conductive layer 206.

Figure 2J:
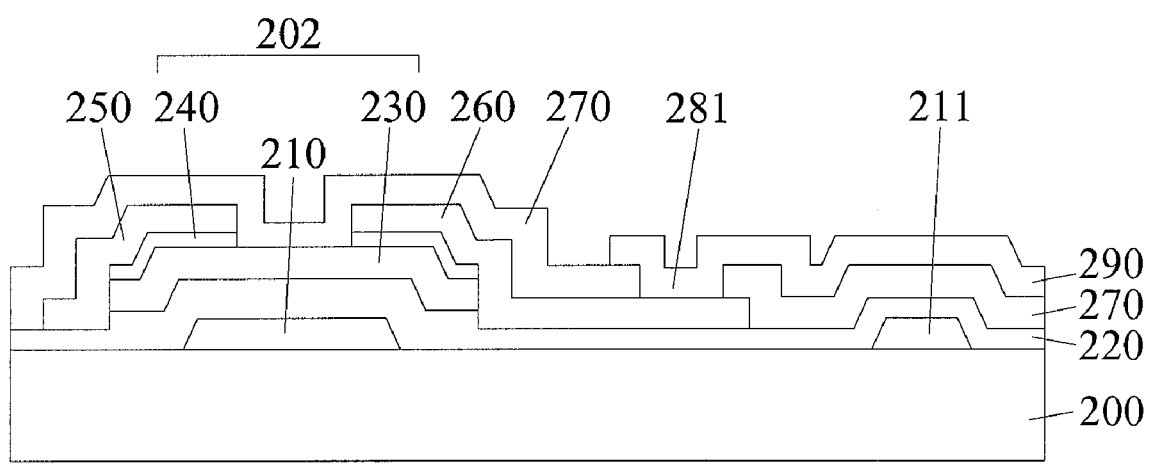

Referring to FIG. 2J, next, a fifth photolithographic etching process is performed to the transparent conductive layer 206 to define a pixel electrode 290 and the pixel electrode 290 then covers on storage capacitance electrode 211 to be electrically connected to the drain 260 via the first contact hole 281. In one embodiment, a mixed solution of HCl and $HNO_3$ or a mixed solution of HCl and $FeCl_2$ are used in the wet etching procedure of the ITO layer, thereby forming the pixel electrode 290 required.

Referring to FIG. 2J, the pixel electrode 290 stacks on the passivation layer 270, and the gate insulation layer 220 is opposite to the storage capacitance electrode 211 to form a storage capacitance of the pixel. When the second photolithographic etching process is performed to the ohmic contact layer 240 and the active layer 230, a part of the gate insulation layer 220 exposed out of the island semiconductor 202 is etched at the same time. Consequently, a thickness of the gate insulation layer 220 exposed out of the island semiconductor 202 is reduced to ⅓~⅔ of an original thickness thereof, a distance between the pixel electrode 290 and the storage capacitance electrode 211 is decreased, and a storage capacitance of the pixel is increased. Hence, a width of the storage capacitance electrode 211 is suitably reduced to increase an aperture ratio of the product.

FIGS. 3A through 3F are cross-sectional views of five conventional photolithographic etching processes in a method of manufacturing a TFT according to a second embodiment of the present invention. As a first and a second photolithographic etching processes of the second embodiment is identical to the first and the second photolithographic etching processes of the first embodiment (referring to FIGS. 2A-2D), thus are not repeated herein.

Figure 3A:
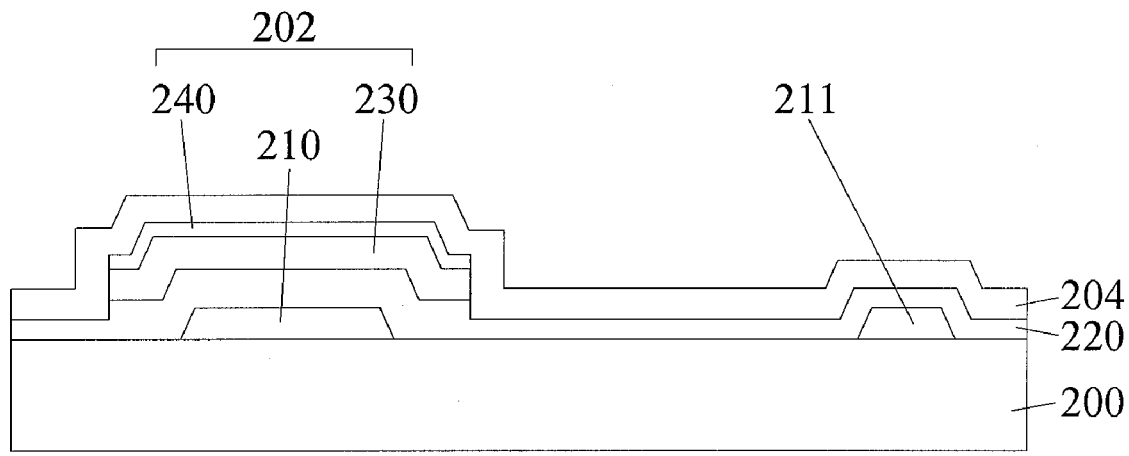
FIGS. 3A through 3F are cross-sectional views of five conventional photolithographic etching processes in a method of manufacturing a TFT according to a second embodiment of the present invention.

Referring to FIG. 3A, after the island semiconductor 202 is defined on the insulation substrate 200, the second metal layer 204 is formed on the ohmic contact layer 240, the active layer 230, the gate insulation layer 220, and the insulation substrate 200. A second metal layer 204 with a thickness of approximately 1000 to 5000 Angstroms is formed by sputtering at a temperature of approximately 25 to 100° C. Generally, a material of the second metal layer 204 is selected from chromium, titanium, molybdenum, aluminum, copper, aluminum alloy, or a combination thereof. Under certain circumstances, the second metal layer 204 also adopts a multi-layer structure formed by the materials aforementioned.

Figure 3B:
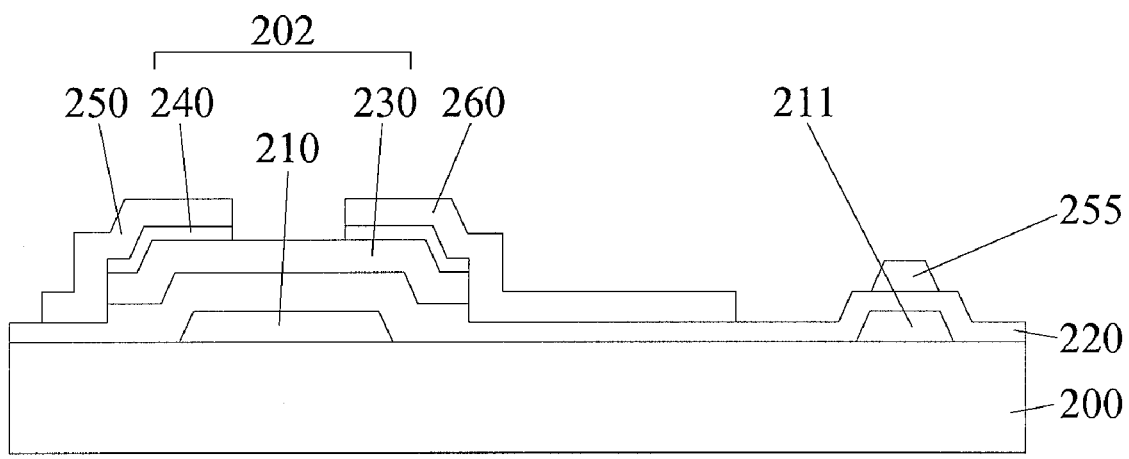

Referring to FIG. 3B, afterwards, a third photolithographic etching process is performed to the second metal layer 204 to define the source 250, the drain 260, and the auxiliary electrode 255 on the insulation substrate 200, and to make the auxiliary electrode 255 opposite to the storage capacitance electrode 211. In one embodiment, the wet etching process is applied in the photolithographic etching process. Subsequently, the source 250 and the drain 260 are used as a mask for etching the ohmic contact layer 240 to form the back channel region of the TFT.

Figure 3C:
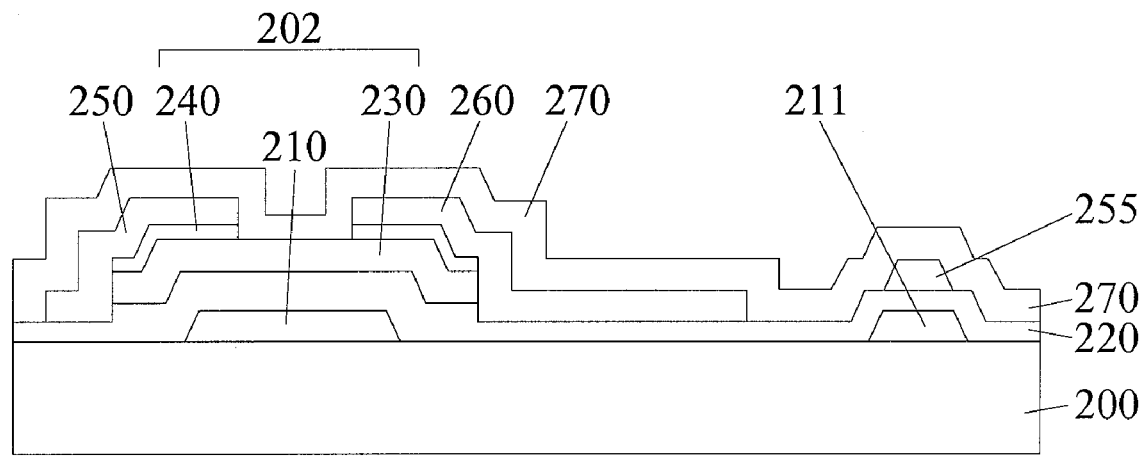

Referring to FIG. 3C, the passivation layer 270 is then formed on the source 250, the drain 260, the auxiliary electrode 255, the active layer 230, and the gate insulation layer 220 for moisture blockage and protection. A material of the passivation layer 270 is selected from conventional dielectric materials such as nitride layers, oxide layers, organic materials, or a combination thereof. In one embodiment, the PECVD is utilized to form a silicon oxide or silicon nitride layer with a thickness of approximately 2000 to 4000 Angstroms in an environment with a temperature of 330° C. Reactive gases adopted in the process include $SiH_4$, $N_2O$, $NH_3$, $N_2$ or $SiH_2Cl_2$, $NH_3$, $N_2$, $N_2O$.

Figure 3D:
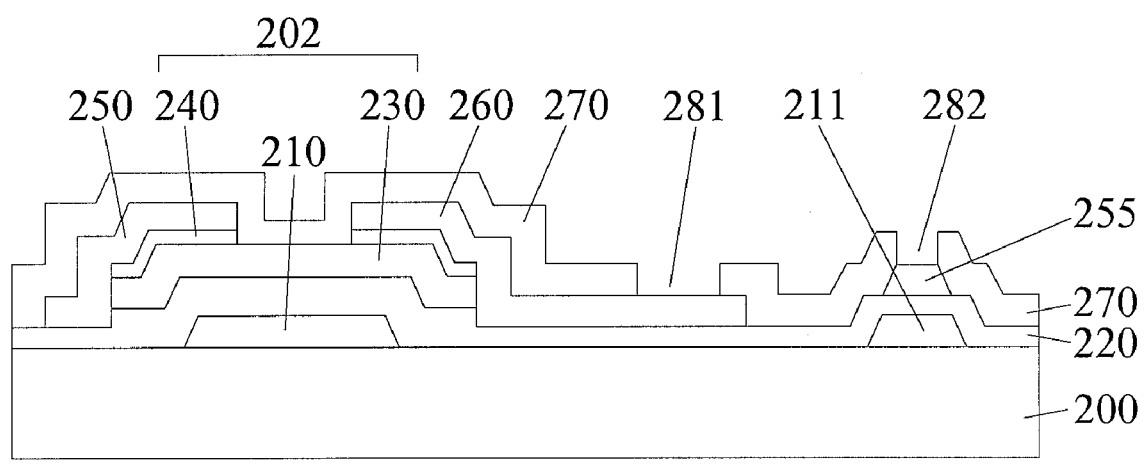

Referring to FIG. 3D, a fourth photolithographic etching process is performed to the passivation layer 270 to define a contact hole 281 and a second contact hole 282, so that a part of the drain 260 is exposed via the first contact hole 281 and a part of the auxiliary electrode 255 is exposed via the second contact hole 282. In one embodiment, the dry etching process is applied in the photolithographic etching process.

Figure 3E:
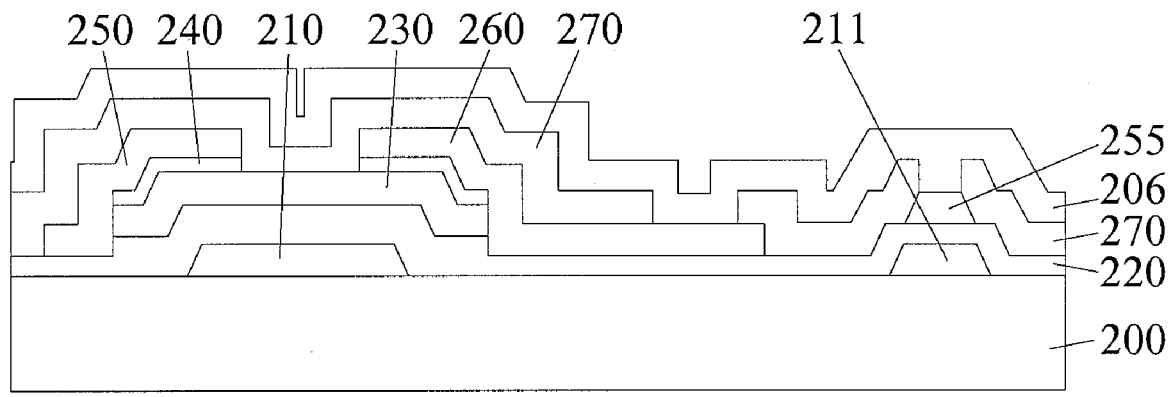

Referring to FIG. 3E, the transparent conductive layer 206 is formed on the upper surface of the passivation layer 270. In one embodiment, the ITO thin film with a thickness of approximately 500 to 1000 Angstroms is formed by sputtering at a temperature of approximately 25° C. and is adopted as the transparent conductive layer 206.

Figure 3F:
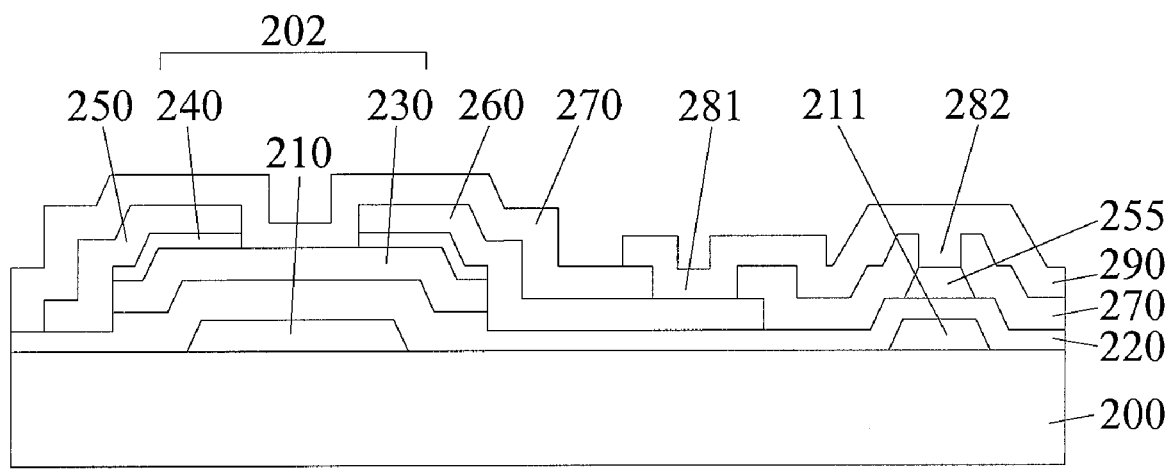

Referring to FIG. 3F, later, a fifth photolithographic etching process is performed to the transparent conductive layer 206 to define the pixel electrode 290 and the pixel electrode 290 then covers on storage capacitance electrode 211 to be electrically connected to the drain 260 and the auxiliary electrode 255 via the first contact hole 281 and the second contact hole 282 respectively. In one embodiment, a mixed solution of HCl and $HNO_3$ or a mixed solution of HCl and $FeCl_2$ are used in the wet etching procedure of the ITO layer, thereby forming the pixel electrode 290 required.

Referring to FIG. 3F, the pixel electrode 290 electrically connects with the auxiliary electrode 255 and stacks on the gate insulation layer 220. The pixel electrode 290 is opposite to the storage capacitance electrode 211 to form a storage capacitance of the pixel. When the second photolithographic etching process is performed to the ohmic contact layer 240 and the active layer 230, a part of the gate insulation layer 220 exposed out of the island semiconductor 202 is etched at the same time. Consequently, the thickness of the gate insulation layer 220 exposed out of the island semiconductor 202 is reduced to ⅓~⅔ of the original thickness thereof, a distance between the auxiliary electrode 255 and the storage capacitance electrode 211 is reduced, and the storage capacitance of the pixel is increased. Hence, a width of the storage capacitance electrode 211 is suitably reduced to increase an aperture ratio of the product.

In summary, a feature of the method of manufacturing the TFT in the present invention is to provide a new etching process of the island semiconductor. This new etching process of the island semiconductor is controlled by the flow rate of the etching gas and the regulation of the etching power. Therefore, when etching the island semiconductor, a part of the gate insulation layer exposed out of the island semiconductor is etched simultaneously. As a result, the thickness of the gate insulation layer over the storage capacitance electrode is reduced, the distance between the pixel electrode and the storage capacitance electrode is reduced, and the storage capacitance of the pixel is increased. Hence, the width of the storage capacitance electrode is reduced suitably to increase the aperture ratio of the product. The new island semiconductor etching process is compatible with the original manufacturing process, thus no additional steps are required.

The embodiments described hereinbefore are chosen and described in order to best explain the principles of the invention and its best mode practical application. It is not intended to be exhaustive to limit the invention to the precise form or to the exemplary embodiments disclosed. Namely, persons skilled in the art are enabled to understand the invention through various embodiments with various modifications as are suited to the particular use or implementation contemplated. It is intended that the scope of the invention be defined by the claims appended hereto and their equivalents in which all terms are meant in their broadest reasonable sense unless otherwise indicated.

What is claimed is:

1. A method of manufacturing a thin film transistor (TFT), comprising:

providing an insulation substrate;

forming a first metal layer on the insulation substrate and defining a gate and a storage capacitance electrode by a first photolithographic etching process;

forming a gate insulation layer, an active layer, and an ohmic contact layer sequentially on the insulation substrate having the first metal layer, and subsequently defining an island semiconductor structure by a second photolithographic etching process and etching a part of the gate insulation layer exposed out of the island semiconductor at the same time, wherein a thickness of the gate insulation layer exposed out of the island semiconductor is reduced to $\frac{1}{3} \sim \frac{2}{3}$ of a thickness of the gate insulation layer covered by the island semiconductor;

forming a second metal layer on the insulation substrate having the island semiconductor, defining a source and a drain by a third photolithographic etching process, and applying the second metal layer as a mask for etching the ohmic contact layer so as to form a thin film transistor back channel region;

forming a passivation layer on the insulation substrate having the source and the drain, defining a first contact hole by a fourth photolithographic etching process to expose a part of the drain; and forming a transparent conductive layer on the insulation substrate having the contact hole, defining a pixel electrode by a fifth photolithographic etching process for the pixel electrode to cover on the storage capacitance electrode and for the pixel electrode and the drain to electrically connect via the first contact hole.

2. The method of manufacturing the TFT as claimed in claim 1, wherein an auxiliary electrode is defined by the third photolithographic etching process, and the auxiliary electrode is opposite to the storage capacitance electrode.

3. The method of manufacturing the TFT as claimed in claim 2, wherein a second contact hole is defined by the fourth photolithographic etching process to expose a part of the auxiliary electrode.

4. The method of manufacturing the TFT as claimed in claim 3, wherein the pixel electrode and the auxiliary electrode are electrically connected via the second contact hole.

5. The method of manufacturing the TFT as claimed in claim 1, wherein a method of etching the island semiconductor and the gate insulation layer includes a dry etching process.

6. The method of manufacturing the TFT as claimed in claim 5, wherein a reactive gas in the dry etching process comprises a mixed gas of sulfur hexafluoride ($SF_6$) and chlorine ($Cl_2$).

7. The method of manufacturing the TFT as claimed in claim 6, wherein a flow rate of the $SF_6$ in the dry etching process is 120~300 ml/min.

8. The method of manufacturing the TFT as claimed in claim 6, wherein a flow rate of the $Cl_2$ in the dry etching process is 100~800 ml/min.

9. The method of manufacturing the TFT as claimed in claim 5, wherein a power of the dry etching process is substantially 3000~4200 W.

10. The method of manufacturing the TFT as claimed in claim 1, wherein a material of the gate insulation layer comprises silicon oxide, silicon nitride, silicon oxynitride, or a combination thereof.

11. The method of manufacturing the TFT as claimed in claim 1, wherein a material of the active layer comprises amorphous silicon.

12. The method of manufacturing the TFT as claimed in claim 1, wherein a material of the ohmic contact layer comprises n+ doped silicon.

* * * * *